United States Patent [19]
Miyamoto et al.

[11] Patent Number: 5,878,171
[45] Date of Patent: Mar. 2, 1999

[54] ENCODING APPARATUS

[75] Inventors: Masayuki Miyamoto, Nabari; Kunihiko Iizuka, Sakai; Hirofumi Matsui, Ikoma; Mitsuhiko Fujio, Iizuka, all of Japan

[73] Assignee: Sharp Kabushiki Kaisha, Osaka, Japan

[21] Appl. No.: 671,418

[22] Filed: Jun. 27, 1996

[30] Foreign Application Priority Data

Jun. 28, 1995 [JP] Japan ..................................... 7-162692
May 15, 1996 [JP] Japan ..................................... 8-120618

[51] Int. Cl.$^6$ ....................................................... G06K 9/38
[52] U.S. Cl. ............................................................. 382/253
[58] Field of Search ..................................... 382/166, 218, 382/232, 234, 235, 251, 253; 341/172; 704/222; 330/9, 51, 107, 294

[56] References Cited

U.S. PATENT DOCUMENTS 4,555,668  11/1985  Gregorian et al. ........................... 330/9
5,142,238   8/1992  White .......................................... 330/9
5,502,441   3/1996  Swenson ................................... 341/172

FOREIGN PATENT DOCUMENTS 62-183284  8/1987  Japan .
183284    11/1987  Japan ............................. H04N 7/137

*Primary Examiner*—Amelia Au
*Assistant Examiner*—Samir Ahmed
*Attorney, Agent, or Firm*—David G. Conlin; William J. Daley, Jr.; David D. Lowry

[57] ABSTRACT

An encoding apparatus uses a vector quantization encoding method for encoding indexes of codewords, which supply a scalar quantized code of a maximum scalar product value of each code word in a code book, and its maximum scalar product value to a vector component of an input image inputted from an image sensor, so as to output the encoded indexes. A scalar product value calculating circuit in the encoding apparatus has scalar product value calculating sections, which are composed of an analog circuit having a code component capacitor corresponding to each code component, a differential amplifier and a feedback capacitor, corresponding to each codeword, and the scalar product values of the input vectors are calculated in parallel by the scalar product value calculating sections. In such a manner, when the analog calculation is made, the scale of the circuit can be decreased and the power consumption can be lowered. Therefore, unlike the case where the calculation is made after A/D conversion, it is possible to avoid a problem that the number of times of calculations and the power consumption are remarkably increased due to increases in the number of dimensions of the input vector and the number of gradations.

11 Claims, 10 Drawing Sheets

FIG. 2

| x1 | x2 | x3 | x4 | x5 | x6 |
|----|----|----|----|----|----|
| x7 | x8 | x9 | x10 | x11 | x12 |
| x13 | x14 | x15 | x16 | x17 | x18 |
| x19 | x20 | x21 | x22 | x23 | x24 |
| x25 | x26 | x27 | x28 | x29 | x30 |
| x31 | x32 | x33 | x34 | x35 | x36 |

⇒ x (x1, x2, ..., x36)

ENCODING APPARATUS

FIELD OF THE INVENTION

The present invention relates to an apparatus for encoding an analog signal, such as an aural signal and a picture signal upon transmitting and recording the analog signal.

BACKGROUND OF THE INVENTION

Upon transmitting and recording an analog signal, such as an aural signal and a picture signal, various kinds of methods of encoding the analog signal to a digital signal which is seldom deteriorated are suggested. Moreover, as to these encoding methods, encoding methods which do not directly transmit or record a digital signal but which is capable of compressing a quantity of data to a fraction of the quantity to a several tenth of the quantity are suggested in order to reduce a transmission time and a memory quantity.

One typical example of the above encoding methods is the vector quantization method. In this vector quantization method, a K-dimensional input vector $\vec{x}$, in which signal levels obtained by successively sampling analog signals to be encoded with a prescribed sampling period are vector components $x_k$, is created first. Here, k represents the number of the vector components, and $k=1, 2, \ldots, K$.

Meanwhile, after plural kinds of sounds or images for learning are previously prepared, vectors, which are learned from the vectors obtained for the aural or picture signal for learning in the above manner are codewords $\vec{c}i$, and a code book b composed of the codewords $\vec{c}i$ corresponding to each signal is cataloged. Here, $i=1, 2, \ldots, M$, and i which represents an identification number is referred to as an index.

In each codeword $\vec{c}i$ in the cataloged code book b, a codeword $\vec{c}I$ which is closest to the input vector $\vec{x}$ is obtained, and only the index I of the codeword $\vec{c}I$ is transmitted or recorded.

Namely, the codeword $\vec{c}I$ for obtaining the minimum value of the following equation:

$$|\vec{x}-\vec{ci}|^2 = \sum_{k=1}^{K} (xk - cik)^2 \quad (1)$$

is determined and its index I is transmitted or recorded.

As a result, a quantity of data becomes $\log_2 M$ (bit/1 vector). Therefore, in the picture signal, for example, if 256(=M) codewords are cataloged in the code book b in a processing unit block of $K=6\times6=36$ pixels, $256=2^8$, so data quantity becomes $8/36=0.22$ (bit/pixel). As a result, the data quantity can be reduced to 1/36 compared with the case where scalar quantization of 8 bits is performed per pixel.

As an encoding method for compressing a quantity of data which is attained by further developing the abovementioned vector quantization method, a normalized vector quantization (also referred to as gain/shape vector quantization) method is given. In this normalized vector quantization method, each codeword $C_i$ in the code book B has size 1, namely:

$$|\vec{C}i|=(\vec{C}i,\vec{C}i)^{1/2}=1 \quad (2)$$

The codeword $\vec{C}I$ is obtained so that an absolute value of a scalar product:

$$(\vec{x},\vec{Ci}) = \sum_{k=1}^{K} (xk \cdot Cik) \quad (3)$$

of the input vector $\vec{x}$ and each codeword $\vec{C}i$ becomes maximum, and the input vector $\vec{x}$ is made an approximation with $(\vec{x}, \vec{C}I)\cdot\vec{C}I$, and $(\vec{x}, \vec{C}I)$ is scalar-quantized. This is because the following reason.

When A is the scalar amount, according to $|\vec{C}i|^2=1$, the following equation is obtained:

$$|\vec{x}-A\cdot\vec{Ci}|^2 = |\vec{x}|^2 - 2A(\vec{x},\vec{Ci}) + A^2|\vec{Ci}|^2 \quad (4)$$
$$= \{A-(\vec{x},\vec{Ci})\}^2 + |\vec{x}|^2 - (\vec{x},\vec{Ci})^2$$

In the above equation, the relationship between $|\vec{x}|^2$ of the second term and $(\vec{x}, \vec{C}i)^2$ of the third term on the right side becomes $|(\vec{x}, \vec{C}i)|^2 \leq |\vec{x}|^2$. Therefore, the codeword $\vec{C}i$ is the codeword $\vec{C}I$ which maximizes the absolute value $|(\vec{x}, \vec{C}i)|$ of the scalar product, and when $A=(\vec{x}, \vec{C}i)$ is fulfilled, the value of the left side becomes minimum, so $(\vec{x}, \vec{C}I)\cdot\vec{C}I$ is the vector which is the closest to the input vector $\vec{x}$.

In such a manner, the code book B which is required for a compression side and an extension side can be made small, namely, the number of cataloged codewords M can be reduced.

In addition, in order to make it possible to reduce the number of cataloged codewords M, the mean-separated normalized vector quantization (also referred to as differential normalized vector quantization or mean/gain/shape vector quantization) method, which is attained by further developing the normalized vector quantization method, is suggested. In the mean-separated normalized vector quantization method, first, a mean value $\mu$ of each component in the input vector $\vec{x}$ is obtained according to the following equation:

$$\mu = \frac{1}{K} \cdot \sum_{k=1}^{K} xk \quad (5)$$

Next, a differential component vector $\vec{X}=(X_1, X_2, \ldots, X_K)$ is obtained by subtracting the mean value $\mu$ from the input vector $\vec{x}$ according to the following equation:

$$\vec{X}=\vec{x}-\mu\cdot\vec{U} \quad (6)$$

in which $\vec{U}$ is a vector composed of $(1, 1, \ldots, 1)$.

Then, in the codeword $\vec{C}i$ of the unit length in the code book B used in the normalized vector quantization method, the codeword $\vec{C}I$, which maximizes the absolute value $|(\vec{X}, \vec{C}i)|$ of a scalar product, is obtained. The mean value $\mu$ and the scalar product value P having the maximum absolute value obtained in such a manner are scalar-quantized, and the index I is binarized so that compressed codes are created and they are transmitted or recorded.

It is learned that since a mean value of the differential vector $\vec{X}$ obtained by subtracting the mean value $\mu$ becomes zero, the mean value of each codeword $\vec{C}I$ becomes zero accordingly. As a result, the following relationship is satisfied:

$$\begin{aligned}(\vec{X},\vec{CI}) &= (\vec{x}-\mu\cdot\vec{U},\vec{CI}) \\ &= (\vec{x},\vec{CI})-\mu(\vec{U},\vec{CI}) \\ &= (\vec{x},\vec{CI})\end{aligned}$$

so the calculation of subtracting a mean value is not required.

According to the compressed codes which have been transmitted or reproduced, an extension unit decodes an output vector xout as follows:

$$\vec{x}out = Pa\cdot\vec{CI}+\mu a\cdot\vec{U} \quad (7)$$

Pa represents the scalar-quantized maximum scalar product absolute value P, and $\mu a$ represents quantized central values of the mean value $\mu$.

As mentioned above, in any vector quantization methods, calculation of the scalar product value and the determination process of the maximum scalar product value are required. Conventionally, as disclosed in Japanese Unexamined Patent Publication No. 62-183284/1987 (Tokukaisho 62-183284), for example, such calculation and determination process are performed by a microprocessor after an analog signal is sampled with a predetermined period so as to be converted into a digital signal.

Therefore, when the sampling frequency, the number of gradation of the signal level, the number of codewords, etc. are increased, an amount of the calculation to be performed by the microprocessor is greatly increased. For example, when the number of codewords is M and the number of dimensions of the vector components in each codeword and the input vector is K, it is necessary to calculate sum of products M×K times in the calculation of the scalar product value.

Therefore, when a multiplier is arranged so that the above calculations are made, there arises a problem that a circuit of the microprocessor becomes large-sized. Moreover, in the case where a picture signal is treated, high-speed operation is required, so power consumption is increased. Furthermore, since not only the microprocessor but also an analog/digital converter are required, a circuit around the microprocessor also becomes large-sized. Moreover, when a signal of dozens MHz, such as the picture signal, is treated, there arises a problem that the power consumption of the analog/digital converter is increased.

SUMMARY OF THE INVENTION

It is an object of the present invention to provide an encoding apparatus, for encoding an analog signal using the vector quantization method, in which a scale of a circuit can be reduced and power consumption can be lowered.

In order to achieve the above object, the encoding apparatus of the present invention includes:

a plurality of scalar product value calculating sections which are provided correspondingly to codewords representing learning vectors created from a plural kinds of signals for learning, the plural scalar product value calculating sections having elements with constants corresponding to plural code components composing the codewords, the plural scalar product value calculating sections calculating scalar products of the input vector and the codewords according to calculation using the constants of the elements;

a correlation detecting section for detecting the codeword which is most correlative in the codewords to the input vector based upon the scalar product calculated by the scalar product value calculating section; and an encoding section for encoding an identification number for identifying the codeword which detected by the correlation detecting section that the codeword is most correlative to the input vector.

In accordance with the above arrangement, in the apparatus for sampling an analog signal to be encoded, such as an aural signal or a picture signal and taking in the sampled analog signal as an input vector so as to encode the signal based upon vector quantization algorithm, the signals corresponding to the vector components of the input vector are respectively supplied to the scalar product value calculating sections which are arranged so as to have elements with the constants corresponding to the code components of the codewords. As a result, in each of the scalar product value calculating sections, the respective scalar products of the codewords and the input vectors can be obtained by analog calculation using the constants of the elements. Moreover, the correlation detecting section detects the codeword which is most correlative to the input vector based upon the scalar product values. Then, an identification number of the codeword which is most correlative to the input vector is encoded by the encoding section.

Therefore, in the case where the calculation of scalar products and the judging process of a maximum scalar product value are carried out on a lot of codewords corresponding to the input vectors so that vector quantization is carried out, the scalar product calculating sections can be realized by an analog circuit. For this reason, the apparatus, which encodes a picture signal, etc. in which the number of gradations of a signal level and the number of codewords are comparatively large, is capable of calculating the scalar product values with low power consumption even if the scale of the circuit is small.

In addition, the operating frequency of the analog/digital converter to be used for encoding the calculation result of the maximum scalar product value rapidly becomes lower than the operating frequency of the similar analog/digital converter used in an apparatus for calculating scalar product values after converting an analog signal into a digital signal. Therefore, peripheral circuits including the analog/digital converter can be miniaturized, and the power consumption of the peripheral circuits can be lowered.

Each of the scalar product value calculating sections in the encoding apparatus preferable includes:

a plurality of capacitors for inputting the sampled analog signals to one ends thereof, the capacitors being formed so as to have electrostatic capacities as the constants;

a differential amplifier having two input terminals, the other ends of the capacitors commonly being connected to one input terminal, a predetermined reference voltage being inputted into to the other input terminal; and a feedback capacitor for intervening between the input and output terminals of the differential amplifier.

In accordance with the above arrangement, when the number of dimensions of the input vectors and the codewords is represented by k (k=1, 2, . . . , K), each vector component of the input vectors is represented by Vk, the electrostatic capacity of each capacitor is represented by Hk, the electrostatic capacity of the feedback capacitor is represented by h, the reference voltage is Vref and the output voltage of the differential amplifier is Vo, as to the differential amplifier, the following relationship is fulfilled:

$$Vo - Vref = -\sum_{k=1}^{K} \frac{Hk}{h} \cdot (Vk - Vref)$$

As a result, the scalar product values of each vector component (Vk–Vref) and the coefficients (–Hk/h) can be calculated as (Vo–Vref).

In addition, the scalar product value calculating sections further preferably includes:

first and second differential amplifiers as the differential amplifier to which the feedback capacitor is respectively connected, the first capacitor of the capacitors, which corresponds to a code component which is a positive coefficient being connected to an inversion input terminal of the first differential amplifier, the second capacitor of the capacitors, which corresponds to a code component which is a negative coefficient being connected to an inversion input terminal of the second differential amplifier; and a coupling capacitor which intervenes between the output terminal of the first differential amplifier and the inversion input terminal of the second differential amplifier, the coupling capacitor having an electrostatic capacity which is equal to that of the feedback capacitor to be connected to the first differential amplifier.

In accordance with the above arrangement, since the electrostatic capacity of the coupling capacitor is formed so as to be equal to the electrostatic capacity of the feedback capacitor to be connected to the first differential amplifier, the output of the first differential amplifier is inverted with a gain "1" so as to be outputted. Meanwhile, the first capacitor whose corresponding code component is a positive coefficient is connected to the inversion input terminal of the first differential amplifier, and the second capacitor whose corresponding code component is a negative coefficient is connected to the inversion input terminal of the second differential amplifier. In such a manner, the code components corresponding to the positive and negative coefficients can be obtained.

Each of the scalar product value calculating sections in the encoding apparatus preferably includes:

a plurality of first capacitors and a plurality of second capacitors for inputting the sampled analog signal to one ends thereof, the first capacitors having electrostatic capacities as the constants corresponding to the respective code components which are positive coefficients, the second capacitors having electrostatic capacities as the constants corresponding to the respective code components which are negative coefficients;

a differential amplifier having a non-inversion input terminal connected to the other ends of the first capacitors and an inversion input terminal connected to the other ends of the second capacitors;

a feedback capacitor which intervenes between the non-inversion input terminal and the output terminal of the differential amplifier; and a capacitor for applying a reference voltage to the non-inversion input terminal of the differential amplifier.

In accordance with the above arrangement, the code components corresponding both the positive and negative coefficients can be realized by using one differential amplifier.

Each of the scalar product value calculating sections in the encoding apparatus preferably includes:

a plurality of first capacitors and a plurality of second capacitors for inputting the sampled analog signal to one ends thereof, the first capacitors having electrostatic capacities as the constants corresponding to the respective code components which are positive coefficients, the second capacitors having electrostatic capacities as the constants corresponding to the respective code components which are negative coefficients;

a first switching circuit for selectively supplying the sampled analog signals or a predetermined reference voltage to one ends of the first and second capacitors;

a differential amplifier having two input terminals, the other ends of the first and second capacitors being commonly connected to the one input terminal, the reference voltage being inputted to the other input terminal;

a feedback capacitor whose one end is connected to the input terminal of the differential amplifier;

a second switching circuit for selectively supplying an output voltage of the differential amplifier or the reference voltage to the other end of the feedback capacitor, the second switching circuit being linked to the first switching circuit; and a switch for coupling the input and output terminals of the differential amplifier so as to be short-circuited.

In accordance with the above arrangement, a voltage of the calculated value according to the code component which is the positive coefficient and a voltage of the calculated value according to the code component which is the negative coefficient are inputted commonly into the one input terminal of the differential amplifier. As a result, one differential amplifier can respond to both the positive and negative coefficients. Moreover, since input offset voltages of the differential amplifier make an effect on the voltages of the two calculated values such that the voltages of the calculated values respectively have the opposite polarity, the input offset voltages can be cancelled. Furthermore, since the potential of the other input terminal of the differential amplifier is maintained as the reference voltage, a common mode voltage is constant, thereby making it possible to secure high performance.

The encoding apparatus having the scalar product value calculating sections equipped with the first and second capacitors preferably further includes a mean value calculating section which is provided parallel to the scalar product value calculating sections, the mean value calculating section being composed of the capacitors, the differential amplifier and the feedback capacitor like said scalar product value calculating sections, the capacitors respectively having equal electrostatic capacities. The above encoding apparatus is arranged so that the scalar product value calculating sections have absolute value calculating circuits for calculating absolute values of the calculated scalar products, that the first and second capacitors have are arranged so that the sums of the respective electrostatic capacities are mutually equal, and that the correlation detecting section detects the codeword out of the codewords for maximizing an absolute value of the scalar product calculated in the absolute value calculating circuit as the codeword which is most correlative to the input vector.

In accordance with the above arrangement, the sum of the electrostatic capacities corresponding to a positive coefficient and the sum of the electrostatic capacities corresponding to a negative coefficient are mutually equal, thereby making it possible to obtain codewords whose mean value is zero. When such codewords are used, it is possible to obtain the scalar product value of a differential vector, which is a vector of a signal obtained by subtracting the mean value of the input vector from the analog signal, and the codeword.

Therefore, the encoding can be performed by the mean-separated normalized vector quantization method. Moreover, the correlation between the input vector and the positive or negative codeword can be obtained by the absolute value calculating circuit according to the absolute value of the scalar product.

Meanwhile, the mean value calculating sections are formed so that the electrostatic capacities of the capacitors are mutually equal similarly to the arrangement of the scalar product value calculating sections, thereby outputting the mean value of each element in the input vector. This mean value is used for performing a decoding process according to the equation (7). Therefore, the mean value required for the decoding process can be obtained by the mean value calculating section in the encoding process.

For fuller understanding of the nature and advantages of the invention, reference should be made to the ensuing detailed description taken in conjunction with the accompanying drawings.

BRIEF DESCRIPTION OF THE DRAWINGS

FIG. 2 is a drawing which explains a reading procedure as a vector component of luminance levels of each pixel in a processing unit block on the image sensor.

DETAILED DESCRIPTION OF THE PREFERRED EMBODIMENTS

The following describes the first embodiment of the present invention on reference to FIGS. 1 through 4.

Figure 1:
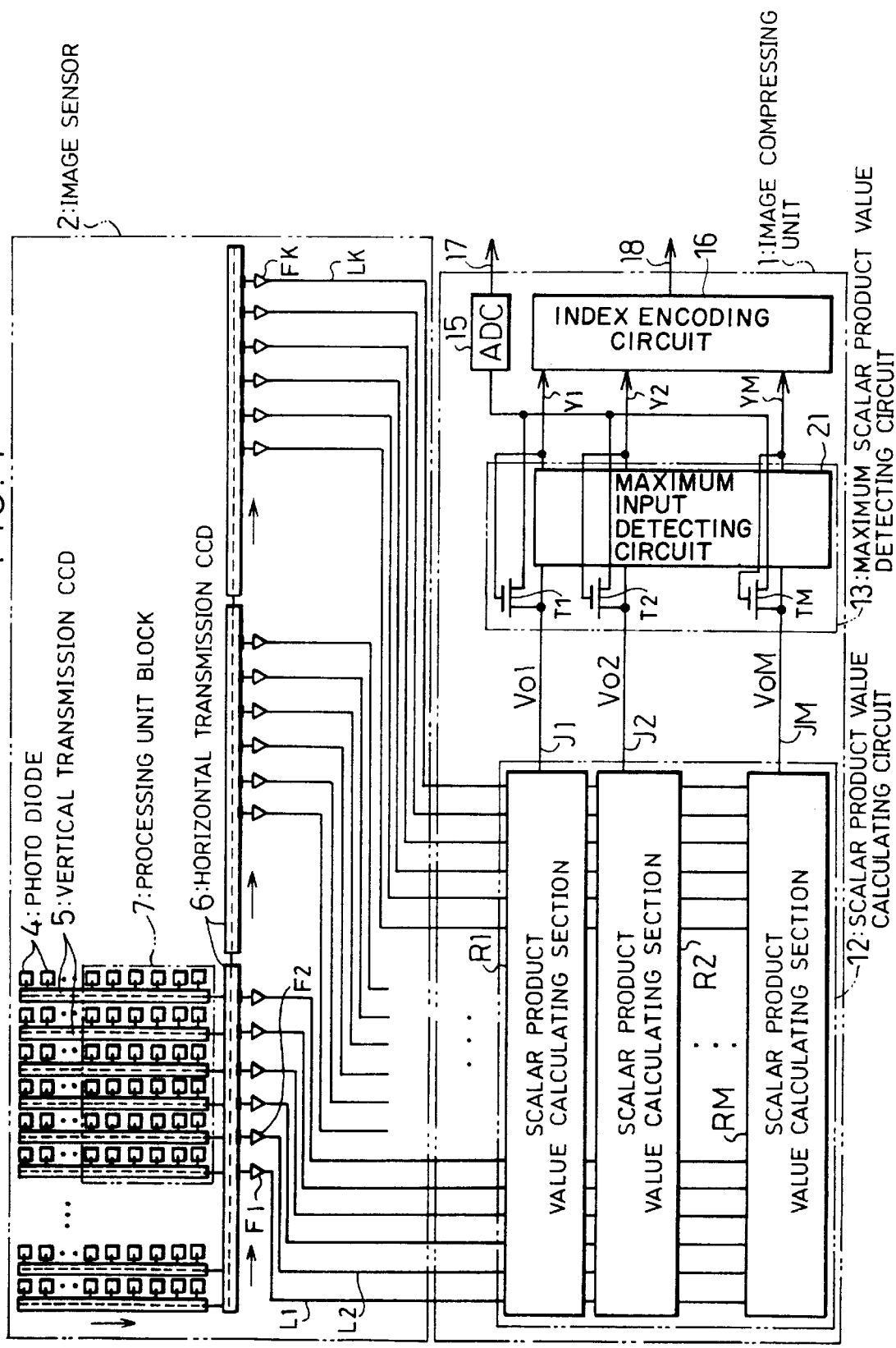
FIG. 1 is a block diagram which shows an electrical arrangement of an image compressing apparatus, which is an encoding apparatus and an image sensor related to the image compressing apparatus according to the first embodiment of the present invention.

FIG. 1 is a block diagram which shows an electric arrangement of an image compressing apparatus 1, which is an encoding apparatus according to the first embodiment of the present invention, and an image sensor 2 related to the image compressing apparatus 1. The image compressing apparatus 1 compresses and encodes a picture signal which was inputted from the image sensor 2 in a manner mentioned later, and outputs encoded data from output lines 17 and 18 to a transmitter, a recording unit, etc., not shown.

The image sensor 2 is arranged so as to have a plurality of photo diodes 4 which are arranged in a matrix-like pattern. The photo diodes 4 which are arranged in a matrix-like pattern are connected to a vertical transmission CCDs (charge coupled devices) 5 which are provided to each line. Moreover, one end of. each vertical transmission CCD 5 is connected to a horizontal transmission CCDs 6. An analog voltage which is respectively held is outputted from each element of the horizontal transmission CCDs 6 through buffers Fk (k=1, 2, . . . , K) to lines Lk (k=1, 2, . . . K).

The plural photo diodes 4 in the image sensor 2 are divided into a plurality of processing unit blocks 7 of 36 pixels (K=6 pixels×6 pixels) as shown in FIG. 2, for example. Output voltages of each photo diode 4 are successively read out per processing unit block 7 by the vertical transmission CCDs 5 and the horizontal transmission CCDs 6 so as to be outputted to the lines Lk. Therefore, as shown in FIG. 2, K-dimensional input vector x, in which signal levels x1, x2, . . . , xK corresponding to the luminance levels of subjects created in each photo diode 4 are vector components, is inputted to the image compressing apparatus 1.

The image compressing apparatus 1 is roughly arranged so as to have a scalar product value calculating circuit 12, a maximum scalar product value detecting circuit 13, an analog/digital converter 15 and an index encoding circuit 16. The scalar product value calculating circuit 12 is composed of a plurality of scalar product value calculating sections Ri (i=1, 2, . . . , M, and M=32, for example. They are generically represented by R). The scalar product value calculating circuit 12 is a circuit for calculating scalar products of different plural codewords and input vector $\vec{x}$. The codewords $\vec{C}i$ are learning vectors which are previously obtained as a plural kinds of picture signals for learning in the same manner as the input vector $\vec{x}$. The scalar product value calculating section Ri calculates the scalar product of one codeword $\vec{C}i$ and the input vector $\vec{x}$, and different scalar product values are respectively outputted from the scalar product value calculating sections Ri. Moreover, each codeword $\vec{C}i$ is composed of K-numbered code components which correspond to the number of dimensions K of the input vector $\vec{x}$.

Figure 3:
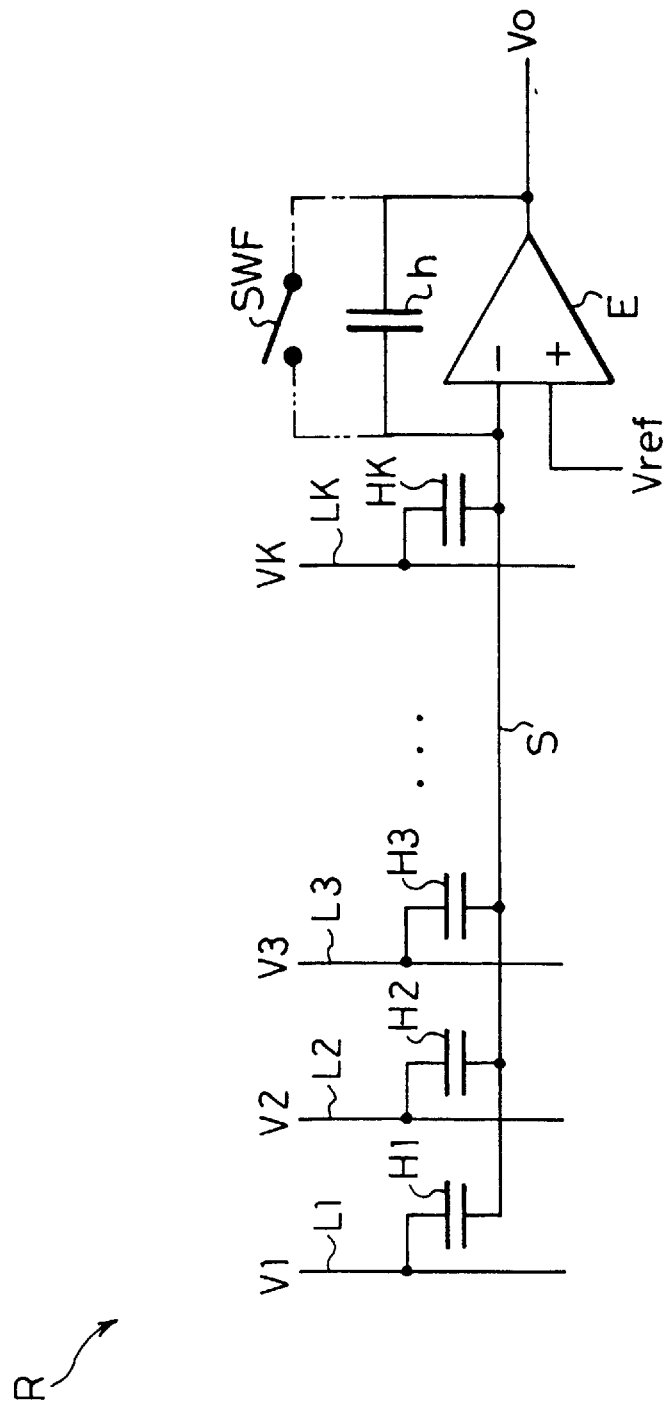
FIG. 3 is an electric circuit diagram which shows an concrete arrangement of a scalar product value calculating section in the image compressing apparatus.

FIG. 3 is an electrical circuit diagram which shows a concrete arrangement of the scalar product value calculating section R according to the first embodiment. The scalar product value calculating section R is composed of K-numbered code component capacitors Hk (generically represented by H) corresponding to the code components, a differential amplifier E and a feedback capacitor h. One ends of each code component capacitor Hk are respectively connected to the lines Lk, and the other ends are commonly connected to an inversion input terminal of the differential amplifier E through an input line S. A reference voltage vref is applied to a non-inversion input terminal of the differential amplifier E. Moreover, the inversion input terminal and an output terminal of the differential amplifier E are connected through the feedback capacitor h.

Here, a MOSFET, or the like is used for the input of the differential amplifier E so that input resistance of the differential amplifier E can be considered infinity, and a refresh circuit shown by SWF, for example, is provided. As a result, before an input voltage is applied, electric charges stored in each code component capacitor Hk shall become 0, and when electric charges of the inversion input terminal side of the differential amplifier E are 0, according to the principle of conservation of charge, the following equation is fulfilled:

$$vo - vref = -\sum_{k=1}^{K} \frac{Hk}{h} \cdot (Vk - Vref) \qquad (8)$$

However, the input voltage from each line Lk is represented by vk, the output voltage of the differential amplifier E is represented by vo. Moreover, here, electrostatic capacities of the code component capacitor Hk and the feedback capacitor h are also represented by the same reference symbols Hk and h respectively.

As a result, it is understood that scalar product values of each vector component (V1−Vref, V2−Vref, ..., VK−Vref) and coefficients (−H1/h, −H2/h, ..., −HK/h) as the code components can be calculated according to (Vo−Vref).

The maximum scalar product value detecting circuit 13 is composed of a maximum input detecting circuit 21 and switching elements Ti corresponding to the scalar product value calculating sections Ri. output lines Yi corresponding to the scalar product value calculating sections Ri are led from the maximum input detecting circuit 21. In the maximum input detecting circuit 21 as a correlation detecting section, as mentioned later, only an output voltage VoutI to the output line YI of an channel I, corresponding to the scalar product value calculating section RI which outputs the highest input voltage VoI out of input voltages Voi from the scalar product value calculating sections Ri through input lines Ji, are at high level, and output voltages Voutj to the output lines Yj of the other channels j (j≠I) are at low level.

The output lines Yi are connected to the index encoding circuit 16. The index encoding circuit 16 as the encoding section converts an index of the channel I (identification number of the codewords Ci), which has been judged that the scalar product value is maximum, into a binary code and outputs the encoded data to the output line 18.

In addition, the output lines Yi are respectively connected to gates of the switching elements Ti. Therefore, the highest voltage VoI is selected by the switching element TI from the input voltages Voi from the scalar product value calculating sections Ri inputted to the switching elements Ti through the input lines Ji so as to be inputted to the analog/digital converter 15, and its voltage level is scalar-quantized so that the quantized data are outputted to the output line 17.

Figure 4:
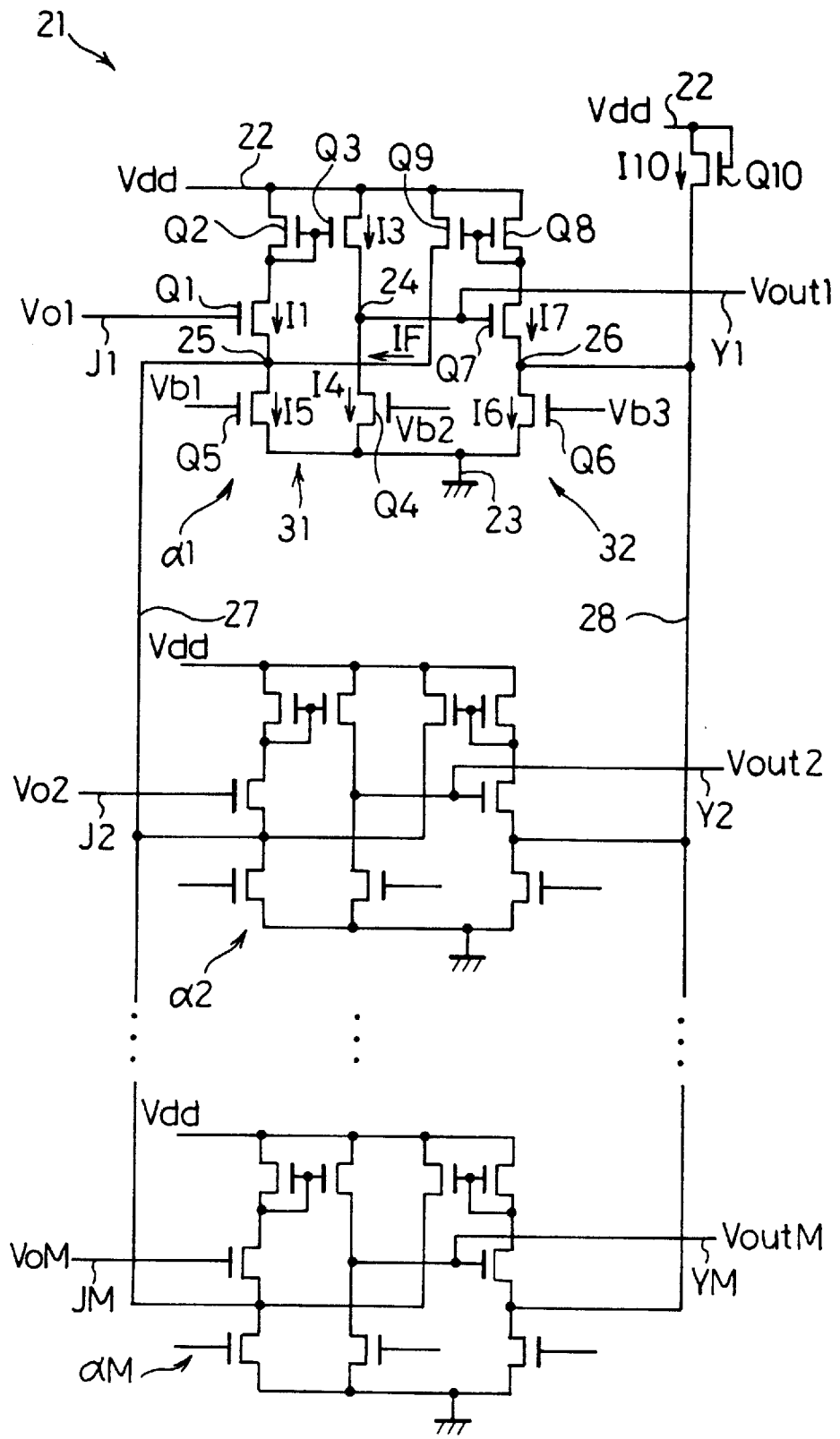
FIG. 4 is an electric circuit diagram which shows a concrete configuration of a maximum input detecting circuit of a maximum scalar product value detecting circuit in the image compressing apparatus.

FIG. 4 is an electric circuit diagram which shows a concrete configuration of the maximum input detecting circuit 21. The maximum input detecting circuit 21 includes basic circuits ai, which individually correspond to analog input voltages Voi of the channels i (i=1, 2, ..., M).

The basic circuit al is arranged so as to have a detecting section 31 having five field effect transistors Q1 through Q5 composed of MOS, and a feedback current generating circuit 32 having four field effect transistors Q6 through Q9. In the detecting section 31, the input voltage Vol from the input line J1 is inputted to the gate of the N-type transistor Q1, and a drain of the transistor Q1 is connected to a drain and the gate of the P-type transistor Q2.

A source of the transistor Q2 is connected to one power source line 22 which is held at a high level voltage Vdd. The P-type transistor Q3 is provided correspondingly to the transistor Q2, and the transistors Q2 and Q3 compose a current mirror circuit. A gate of the transistor Q3 as well as the gate of the transistor Q2 are connected to the drain of the transistor Q1, and a source of the transistor Q3 is connected to the power source line 22, and a drain of the transistor Q3 is connected to a drain of the N-type transistor Q4.

A predetermined constant voltage Vb2 is applied to a gate of the transistor Q4, and its source is connected to the other power source line 23 which is held at an earth level voltage. An output voltage Vout1 according to impedance of the transistors Q3 and Q4 is outputted from a node 24 of the transistors Q3 and Q4. Moreover, the source of the transistor Q1 is connected to a drain of the N-type transistor Q5, and a source of the transistor Q5 is connected to the power source line 23, and a predetermined constant voltage Vb1 is applied to its gate.

The output voltage Vout1 from the node 24 is inputted to the feedback current generating circuit 32 and to a gate of the N-type transistor Q7. A source of the transistor Q7 is connected to the power source line 23 through the N-type transistor Q6. A predetermined constant voltage Vb3 is applied to a gate of the transistor Q6. Therefore, a bias current I6 which flows through the transistor Q6 obtains a constant value which is prescribed by the constant voltage Vb3.

A drain of the transistor Q7 is connected to the power source line 22 through the P-type transistor Q8. The P-type transistor Q9 which is paired with the transistor Q8 is provided, and the transistors Q8 and Q9 compose the current mirror circuit. The transistor Q9 positively feeds back a feedback current IF corresponding to a current flowing the transistor Q7 to a node 25 between the transistors Q1 and Q5.

The other basic circuits α2 through αM have also the same arrangement as the basic circuit α1, and the node 25 on each basic circuit α1 through αM are maintained so as to have the same electric potentials by a connecting line 27. Moreover, a node 26 of the transistors Q7 and Q6 is maintained so as to have the same electric potentials over the basic circuits α1 through αM by a connecting line 28.

In addition, N-type transistors Q10, which supply the bias current I6 of the transistor Q6 are provided commonly to the basic circuits α1 through αM. A gate and a drain of the transistor Q10 are connected to the power source line 22 with the high-level voltage Vdd, and its source is connected to the drain of the transistor Q6, namely, the connecting line 28. The transistors Q1 through Q10 are respectively operated in a saturation region.

First, the following describes a detailed operation of the detecting section 31 in the maximum input detecting circuit 21 which has the above arrangement. A bias current I5 flowing each transistor Q5 is prescribed by the constant voltage Vb1 as mentioned above. Moreover, the transistors Q5 are connected in parallel by a connecting line 27. As a result, a source voltage of the transistor Q1 obtains a value in which all the feedback currents IF from the transistors Q9 and the sum M·I5 of currents I5 flowing each transistor Q5 and currents I1 according to a difference between the source voltage and the input voltage Voi in each transistor Q1 are balanced.

As a result, a voltage, which corresponds to a difference between impedance of the transistor Q3 where the current I3 flows and impedance of the transistor Q4 where the current I4 which is prescribed by the constant voltage Vb2 flows, is outputted from the node 24 as the output voltage Vouti, and is simultaneously inputted to the gate of the transistor Q7. As a result, the transistor Q7 draws a current I7 from the transistor Q8. The current I7 corresponds to a difference between a source voltage of the transistor Q7 and the output voltage Vouti to be inputted to the transistor Q7. The source voltage of the transistor Q7 is obtained according to the sum M·I6 of the currents I6 which are prescribed by the constant voltage Vb3 in the transistors Q6 connected in parallel and currents I10 flowing the transistors Q10. As a result, the current I7 is positively fed back to the node 25 as the feedback current IF which is determined by a ratio of a current flowing the transistor Q8 to a current flowing the transistor Q9.

As a result, as the output voltage Vouti becomes higher than a voltage obtained by adding a threshold voltage Vth required for conduction of the MOSFET to the voltage of the connecting line 28, the feedback current generating circuit 32 positively feeds back a larger feedback current IF to the node 25. Therefore, as the output voltage Vouti becomes higher, the current I1 flowing the transistor Q1, namely, the current I3 flowing the transistor Q3 is decreased more. Meanwhile, when the output voltage Vouti becomes lower than the added voltage, the transistor Q7 is turned off. As a result, the bias current I6 of the transistor Q6 is supplied from the transistor Q10. Such an operation is performed beginning on the basic circuit of a channel where the input voltage Voi is the lowest, and finally, only the basic circuit of the maximum input outputs the output voltage Vouti with a high level so that the maximum value is selected.

The maximum input detecting circuit 21 is detailed in the specification of Japanese Patent Application No. 7-125372/1995 which has been applied by the inventor of the present invention. The maximum input detecting circuit 21 may have another arrangement, such as one which is described in the above specification instead of the above-mentioned arrangement.

As mentioned above, in the image compressing apparatus 1 of the present invention, since the calculation of scalar product values and the judging process of the maximum scalar product values are performed by scalar product value calculating circuit 12 and the maximum scalar product value detecting circuit 13 which are realized by an analog circuit, the circuit configuration can be smaller and the power consumption can be further decreased compared with the case where the calculation of scalar product values and the judging process of maximum scalar product values are performed by the digital signal process. Moreover, the peripheral circuits, such as the analog/digital convertor 15 and the index encoding circuit 16 can be also operated at a lower speed, thereby making it possible to decrease the power consumption by the peripheral circuits.

Figure 5:
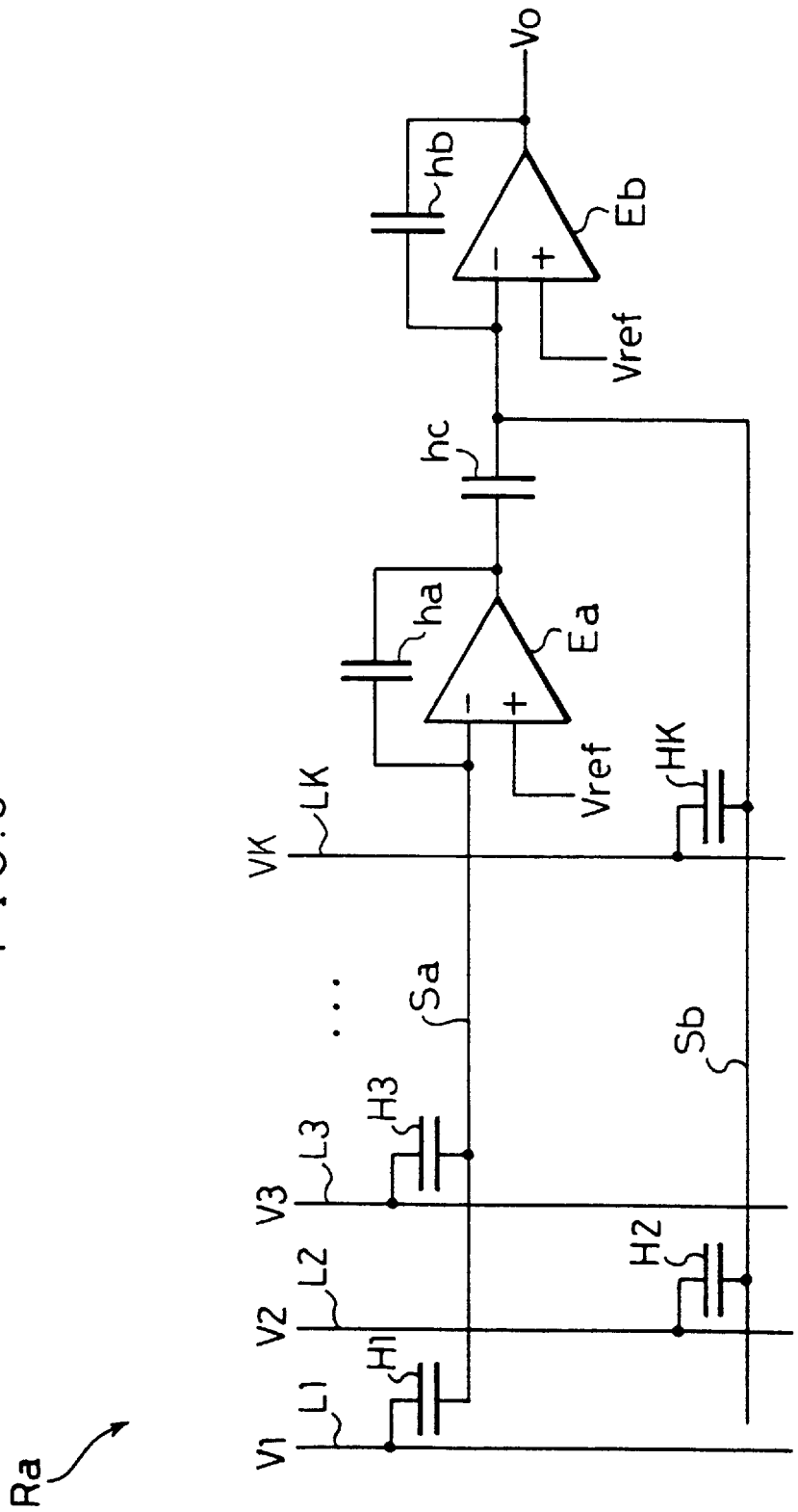
FIG. 5 is an electric circuit diagram which shows a concrete arrangement of the scalar product value calculating section according to the second embodiment of the present invention.

The following describes the second embodiment of the present invention on reference to FIG. 5.

FIG. 5 is an electric circuit diagram of a scalar product value calculating section Ra according to the second embodiment of the present invention. The scalar product value calculating section Ra is similar to the scalar product value calculating section R shown in FIG. 3, and its parts which corresponds to the aforementioned scalar product value calculating section R are indicated by the same reference symbols and the description thereof is omitted. According to the equation (8), only negative or 0 coefficients can be realized in the scalar product value calculating section R. On the contrary, in the scalar product value calculating section Ra, two differential amplifiers Ea and Eb are provided so as to respectively add up positive coefficients and negative coefficients.

Therefore, the code component capacitor $H^+k$ to be a positive coefficient out of the code component capacitors Hk is connected to the inversion input terminal of the differential amplifier Ea through a line Sa, and the code component capacitor $H^-k$ to be a negative coefficient is connected to the inversion input terminal of the differential amplifier Eb through a line Sb. The reference voltage Vref is respectively applied to the non-inversion input terminals of the differential amplifiers Ea and Eb, and the inversion input terminals and output terminals are connected by feedback capacitors ha and hb. The output of the differential amplifier Ea is inputted to the inversion input terminal of the differential amplifier Eb through a coupling capacitor hc.

Therefore, a relationship between the input to the differential amplifier Ea and the output from the differential amplifier Eb is as follows:

$$Vo - Vref = hc/hb \sum_{k=1}^{K} \frac{H^+k}{ha} \cdot (Vk - Vref) - \sum_{k=1}^{K} \frac{H^-k}{hb} \cdot (Vk - Vref) \quad (9)$$

However, in the first and second terms of the right side, only either of the same-dimensional code component capacitors, for example, $H^+1$ and $H^-1$ is a value which corresponds to the coefficient, and it is connected to the line Sa or Sb, and the other capacitor becomes 0. Moreover, when the coefficient is 0, both the capacitors becomes 0, so the capacitors are not connected to the lines Sa and Sb. As shown in FIG. 5, for example, in the code component capacitors H1, H3, . . . , for the positive coefficient, the coefficient is given to the differential amplifier Ea side, and the coefficient on the differential amplifier Eb side is 0.

In such a manner, both the positive and negative coefficients can be used as the code components.

In addition, when hc=ha, the aforementioned equation (9) can be as follows:

$$Vo - Vref = \frac{1}{hb} \left\{ \sum_{k=1}^{K} H^+k \cdot (Vk - Vref) - \sum_{k=1}^{K} H^-k \cdot (Vk - Vref) \right\} \quad (10)$$

Figure 6:
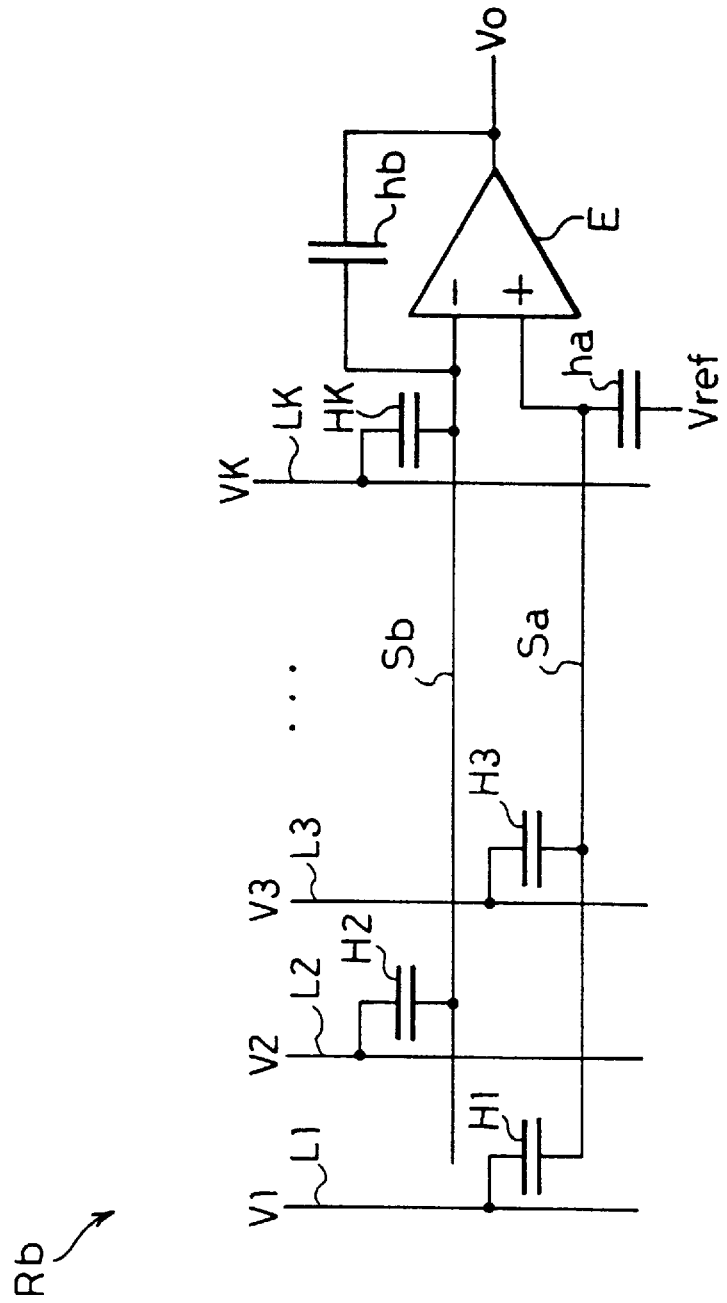
FIG. 6 is an electric circuit diagram which shows a concrete arrangement of the scalar product value calculating section according to the third embodiment of the present invention.

The following describes the third embodiment of the present invention on reference to FIG. 6.

FIG. 6 is an electric circuit diagram of a scalar product value calculating section Rb of the third embodiment. This scalar product value calculating section Rb is similar to the scalar product value calculating section Ra shown in FIG. 5, and its parts of the scalar product value calculating section Rb which corresponds to the scalar product value calculating section Ra are indicated by the same reference numerals and the description thereof is omitted. In the scalar product value calculating section Rb, the number of the differential amplifiers E is one similarly to that in the scalar product value calculating section R shown in FIG. 3, so the code component capacitor $H^+k$ to be a positive coefficient represented by H1, H3 and . . . in ° FIG. 5 is connected to the non-inversion input terminal of the differential amplifier E through the line Sa, and the code component capacitor $H^-k$ to be a negative coefficient represented by H2, . . . and HK is connected to the inversion input terminal of the differential amplifier E through the line Sb. Moreover, the feedback capacitor is the same one which was used as hb, and the reference voltage Vref is inputted to the non-inversion input terminal through the capacitor ha. In such a manner, both the positive and negative coefficients can be realized by using one differential amplifier E.

Figure 7:
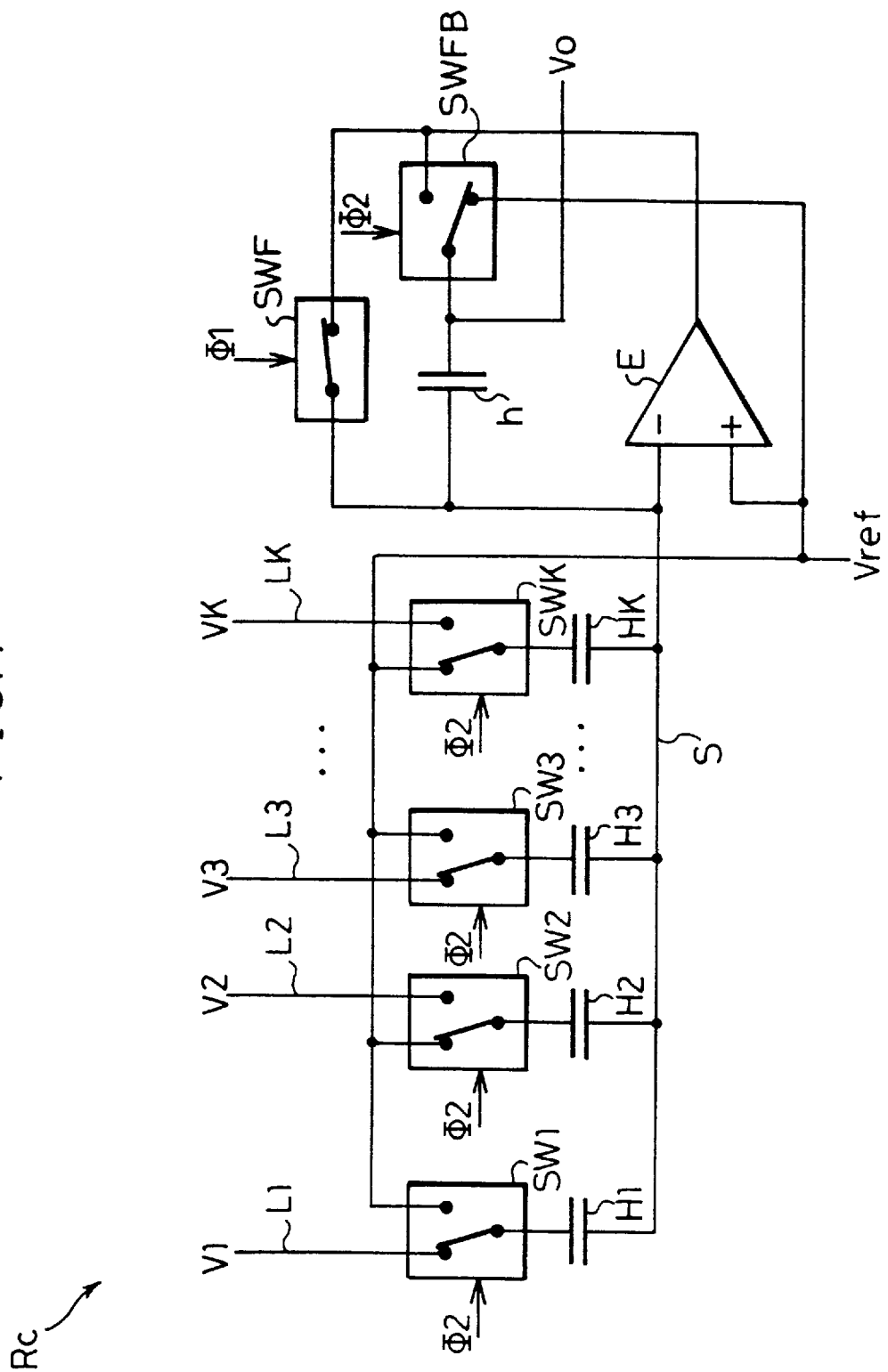
FIG. 7 is an electric circuit diagram which shows a concrete arrangement of the scalar product value calculating section according to the fourth embodiment of the present invention.
Figure 8:
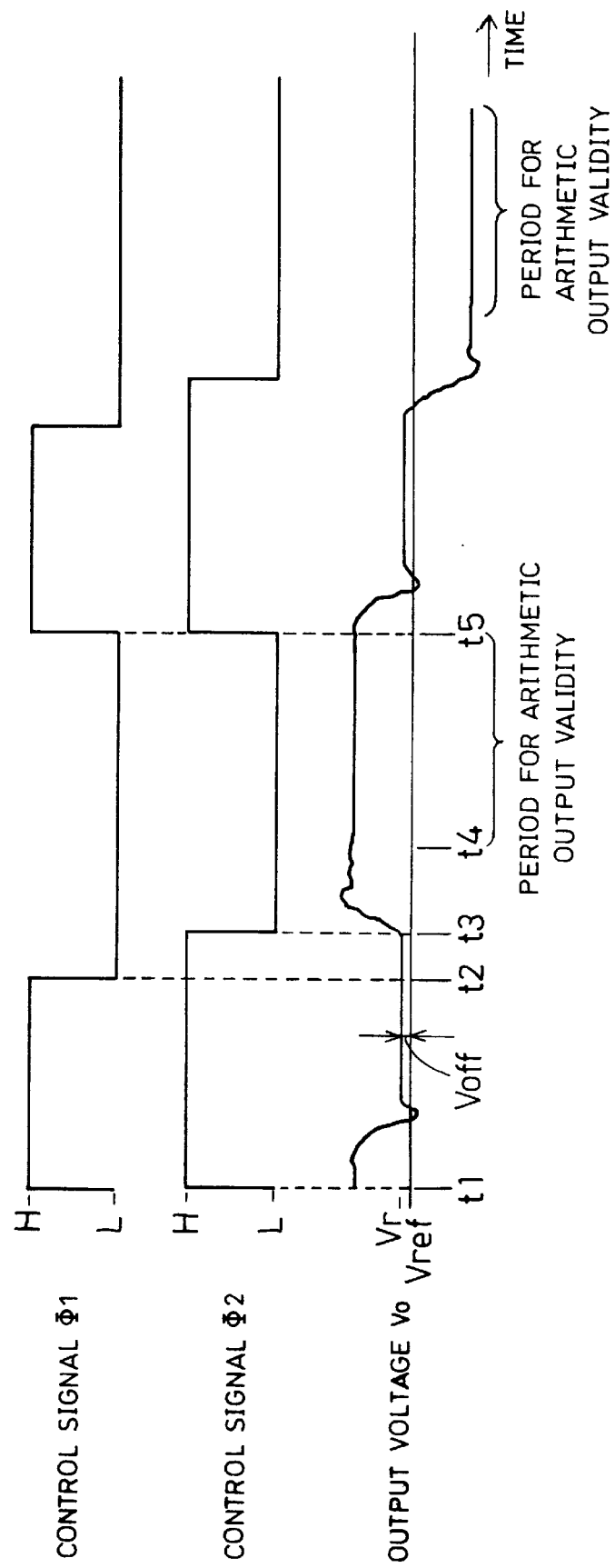
FIG. 8 is a timing chart which explains an operation of the scalar product value calculating section shown in FIG. 7.

The following describes the fourth embodiment of the present invention on reference to FIGS. 7 and 8.

FIG. 7 is an electric circuit diagram of a scalar product value calculating section Rc according to the fourth embodiment of the present invention. It is noticeable that a switching circuit SWk which is the first switching circuit intervenes each line Lk in the scalar product value calculating section Rc. The switching circuit SWk responds to a control signal $\Phi 2$, mentioned later, so as to supply an input voltage Vk through each line Lk or the predetermined reference voltage Vref to one end of the code component capacitors Hk. The other ends of the code component capacitors Hk are connected to the inversion input terminal of the differential amplifier E commonly through the input line S.

When the control signal $\Phi 2$ is at high level, if the corresponding code component capacitor Hk is the code component capacitor H$^+$k for the positive coefficient, the switching circuit SWk respectively applies the input voltages V1, V3, . . . , to the code component capacitors H1, H3, . . . , whereas if the corresponding code component capacitor Hk is the code component capacitor H$^-$k for the negative coefficient, the switching circuit SWk applies the reference voltage Vref to the code component capacitors H2, . . . , HK. Moreover, when the control signal $\Phi 2$ is at low level, the switching circuit SWk applies the reference voltage Vref to the code component capacitors H1, H3, . . . for the positive coefficient, whereas the switching circuit Swk respectively applies the input voltages V2, . . . , VK to the code component capacitors H2, . . . , HK for the negative coefficient.

The reference voltage Vref is applied to the non-inversion input terminal of the differential amplifier E. Moreover, a parallel circuit intervenes between the inversion input terminal and the output terminal of the differential amplifier E. The parallel circuit is composed of a series circuit including the feedback capacitor h and a switching circuit SWFB which is the second switching circuit, and a switch SWF for refreshing. In the switching circuit SWFB, when the control signal $\Phi 2$ is at low level, the feedback capacitor h intervenes between the input and output terminals, whereas when the control signal $\Phi 2$ is at high level, the reference voltage Vref is applied to the feedback capacitor h. The output voltage Vo is taken out between the switching circuit SWFB and the feedback capacitor h. Moreover, when the control signal $\Phi 1$ is at high level, the switch SWF is conducting and the input and output terminals of the differential amplifier E are coupled so that these terminals are short-circuited. Meanwhile, when the control signal $\Phi 1$ is at low level, the switch SWF cuts off the connection between the input and output terminals of the differential amplifier E.

FIG. 8 is a timing chart which explains the operation of the scalar product value calculating section Rc having the above arrangement. As shown in the timing chart, at time t1, when the control signals $\Phi 1$ and $\Phi 2$ are at high level, the switch SWF is conducting and the input and output terminals of the differential amplifier E are coupled so that these terminals are short-circuited. As a result, the differential amplifier E is refreshed, and the switching circuit SWFB contacts the reference voltage Vref side. As a result, the output voltage Vo of the differential amplifier E converges to an operating point voltage Vr.

The relationship "Vr=Vref+Voff" is fulfilled between the operating point voltage Vr of the differential amplifier E and the reference voltage Vref. Here, Voff is an input offset voltage. Therefore, in the state that the output voltage Vo converges to the operating point voltage Vr, electric charges corresponding to Vof f are stored between the terminals of the feedback capacitor h.

At this time, the total quantity Q$^+$ of the electric charges which are induced to the inversion input terminal side of the differential amplifier E can be represented by the following equation:

$$Q^+ = \sum_{k=1}^{K} H^+k(Vk - Vr) + \sum_{k=1}^{K} H^-k(Vr - Vref) + \quad (11)$$

$$h(Vref - Vr)$$

$$= \sum_{k=1}^{K} H^+k\{Vk - (Vref - Voff)\} +$$

$$\sum_{k=1}^{K} H^-k\{(Vref + Voff) - Vref\} +$$

$$h\{Vref - (Vref + Voff)\}$$

$$= \sum_{k=1}^{K} H + k\{Vk - (Vref + Voff)\} +$$

$$\sum_{k=1}^{K} H^-k(Voff) - h(Voff)$$

Thereafter, at the time t2, when the control signal $\Phi 1$ is at low level, the switch SWF is cut off, and thus the inversion input terminal of the differential amplifier E is floated so that the electric charges are maintained. In this state, at the time t3, when the control signal $\Phi 2$ is at low level, the input and output terminals of the differential amplifier E are coupled so that inverting amplification is carried out, and thus the calculation is possible.

At this time, the total quantity Q$^-$ of the electric charges which are induced to the inversion input terminal side of the differential amplifier E can be represented by the following equation:

$$Q^- = \sum_{k=1}^{K} H^+k(Vr - Vref) + \sum_{k=1}^{K} H^-k(Vk - Vr) + \quad (12)$$

$$h(Vo - Vr)$$

$$= \sum_{k=1}^{K} H^+k\{(Vref + Voff) - Vref\} +$$

$$\sum_{k=1}^{K} H^-k\{Vk - (Vref + Voff)\} +$$

$$h\{Vo - (Vref + Voff)\}$$

$$= \sum_{k=1}^{K} H^+k(Voff) + \sum_{k=1}^{K} H^-k\{Vk - (Vref + Voff)\} +$$

$$h\{Vo - (Vref + Voff)\}$$

According to the principle of conservation of charge, since the total charge quantities Q$^+$ and Q$^-$ are mutually equal, when the equations (11) and (12) are solved for the output voltage Vo, the input offset voltage Voff of the differential amplifier E is cancelled, and the following equation is fulfilled:

$$Vo - Vref = \frac{\sum_{k=1}^{K} H^+k(Vk - Vref) - \sum_{k=1}^{K} H^-k(Vk - Vref)}{h} \quad (13)$$

As a result, the scalar product value can be accurately obtained so as to be outputted during a period from time t4 when the output voltage Vo of the differential amplifier E becomes stable to time t5 when the control signals $\Phi 1$ and $\Phi 2$ are at high level.

In other words, in the scalar product value calculating section Rc, the input offset voltage Vof f during the period when the control signal $\Phi 2$ is at high level has opposite polarity to the input offset voltage Voff during the period when the control signal $\Phi 2$ is at low level. In such a manner, an offset can be compensated.

Therefore, the aforementioned scalar product value calculating section Rb has the simple arrangement such that one differential amplifier E is provided, but since the reference voltage Vref is inputted into the differential amplifier E through the capacitor ha, a common code voltage occasionally shifts from the reference voltage Vref due to a value of an input voltage, and the performance is deteriorated. On the contrary, in the scalar product value calculating section Rc of the present embodiment, the non-inversion input terminal of the differential amplifier E is held so as to have the reference voltage Vref, and the input offset voltage Voff is compensated, thereby preventing the above defectiveness.

Here, in the scalar product value calculating sections R and Rc shown in FIGS. 3 and 7, when the code component capacitor Hk is practically formed on an integrated circuit substrate, a lot of capacitor elements with very small electrostatic capacity are respectively formed on regions according to each code component capacitor Hk, and the capacitor elements are selectively detached from the line Lk or the line S. As a result, each code component capacitor is formed so that its electrostatic capacity corresponds to a desired code component.

Similarly, in the scalar product value calculating section Ra shown in FIG. 5 and the scalar product value calculating section Rb shown in FIG. 6, regions for the code component capacitor per the line Sa and Sb are provided to the line Lk, and when very small capacitors in these regions are selectively detached from the line Lk or the lines Sa and Sb, each code component capacitor is formed so that its electrostatic capacity corresponds to a desired positive or negative coefficient.

In addition, in the scalar product value calculating section R shown in FIG. 3, when the electrostatic capacity of each code component capacitor Hk is mutually equal, a mean value can be calculated. This makes it possible to realize an image compressing apparatus $1a$ shown in FIG. 9.

Figure 9:
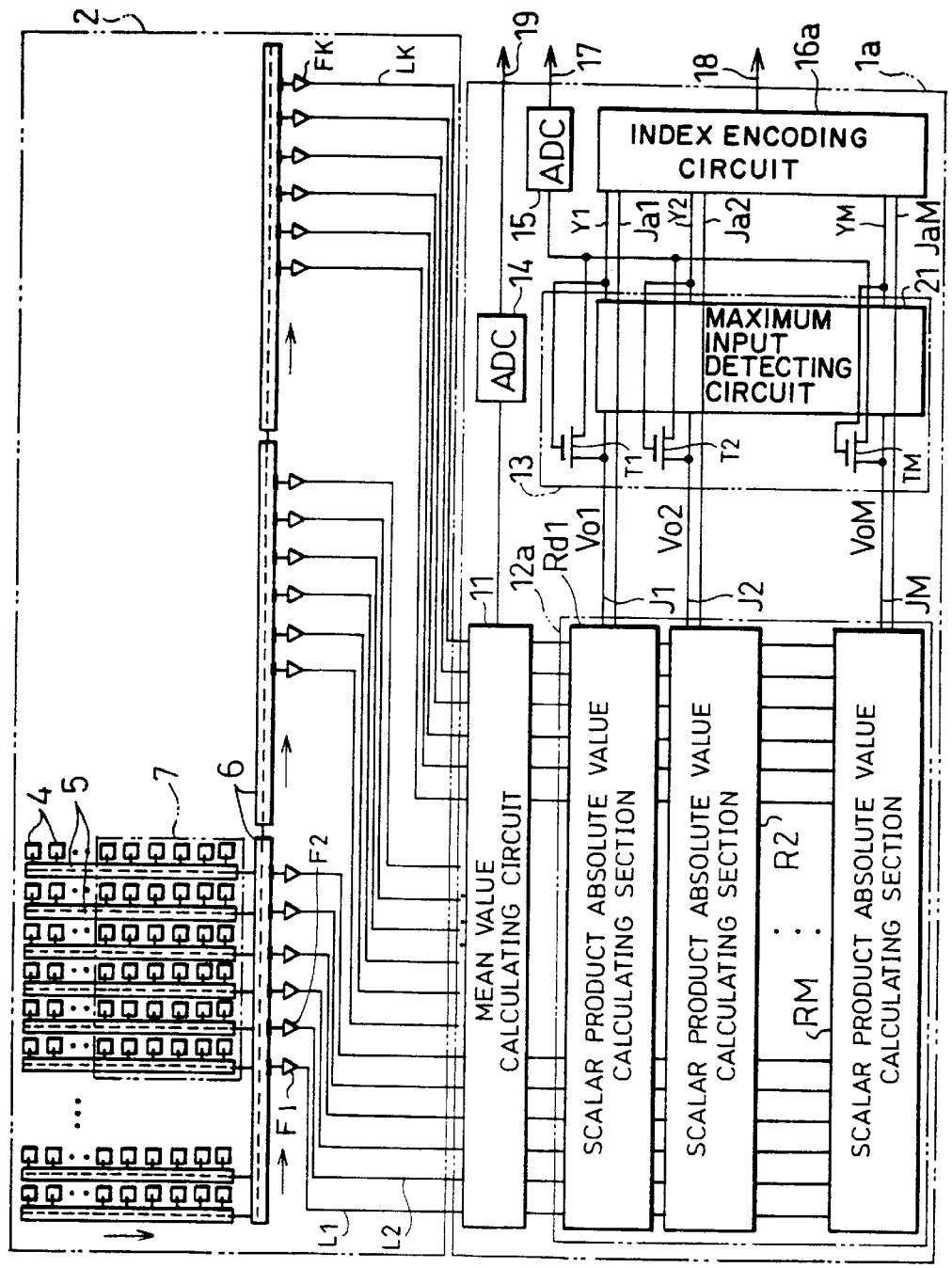
FIG. 9 is a block diagram which shows an electric arrangement of the image compressing unit according to the fifth embodiment of the present invention.

The following describes the fifth embodiment of the present invention on reference to FIG. 9.

FIG. 9 is a block diagram which shows an electric arrangement of the image compressing apparatus $1a$ of the fifth embodiment of the present invention. This image compressing apparatus $1a$ is similar to the aforementioned image compressing apparatus 1, and its parts of the image compressing apparatus $1a$ which corresponds to the image compressing apparatus 1 are indicated by the same reference numerals and the description thereof is omitted. In the image compressing apparatus $1a$, the mean value calculating circuit 11 having the above arrangement is provided in parallel with the scalar product absolute value calculating sections Rdi (i=1, 2, . . . , M: generically represented by Rd) in the scalar product value calculating circuit $12a$. The output from the mean value calculating circuit 11, namely, the mean value of the components in the input vector $\vec{x}$ is scalar-quantized by the analog/digital converter 14 so as to be outputted to the output line 19. The mean value is used when the decoding process is performed according to the equation (7).

The scalar product absolute value calculating sections Rdi respectively obtain scalar products and output them to the maximum input detecting circuit 21 and the switching elements Ti through the lines Ji (generically represented by J). Then, the scalar product absolute value calculating sections Rdi outputs the codes of the scalar products to the index encoding circuit $16a$ through the lines Jai (generically represented by Ja).

Figure 10:
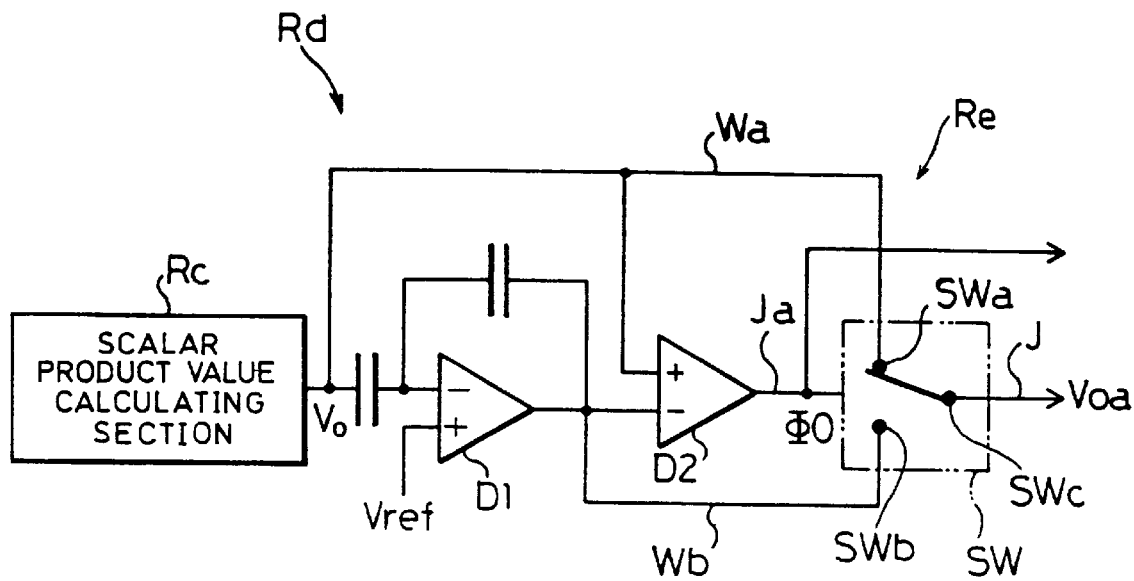
FIG. 10 is an electric circuit diagram which shows an arrangement of a scalar product absolute value calculating section used for the image compressing apparatus shown in FIG. 9.

FIG. 10 is a block diagram which shows a concrete arrangement of the scalar product absolute value calculating section Rd. The scalar product absolute value calculating section Rd is generally arranged so as to have one of the scalar product value calculating sections Ra, Rb and Rc (in the example shown in FIG. 10, the scalar product value calculating section Rc), an absolute value calculating circuit Re including an inverting amplifier D1, a comparator D2 and the switching circuit SW.

The code component capacitors Hk in each scalar product value calculating section Rc are arranged so that the sum of the capacities according to the positive coefficient and the sum of the capacities according to the negative coefficient become mutually equal. Therefore, the code component capacitors Hk in the scalar product value calculating sections Rc become codewords $\vec{C}i$ from which a mean value has been subtracted. When the codewords $\vec{C}i$ from which the mean value has been subtracted are used, the outputs from the scalar product value calculating sections Rc are equivalent to a level of the scalar product values of a differential vector $\vec{X}$, which is a vector of a voltage obtained by subtracting the mean value from the output voltage from each photodiode 4, and of the codewords $\vec{C}i$. As a result, the image compressing apparatus $1a$ can perform encoding through the mean-separated Normalized vector quantization method.

The switching circuit SW has two individual contacts SWa and Swb. The output voltage Vo is directly applied to the individual contact SWa from the scalar product value calculating section Rc through the line Wa, and the output voltage Vo, whose polarity has been inverted in the inverting amplifier D1, is applied to the individual contact SWb from the scalar product value calculating section Rc through the line Wb.

In addition, the output voltage Vo from the scalar product value calculating section Rc is inputted to the non-inversion input terminal of the comparator D2, and on the contrary, the output voltage of the inverting amplifier D1 is inputted to the inversion input terminal of the comparator D2. The comparator D2 mutually compares the non-inversion value and the inversion value of the output voltage Vo from the scalar product value calculating section Rc. Then, the comparator D2 outputs a control signal Φ0, which is at high level when the non-inversion value is larger than the inversion value and is at low level when the inversion value is larger than the non-inversion value, to the index encoding circuit $16a$ and the switching circuit SW through the line Ja.

When the control signal Φ0 is at high level, the switching circuit SW as an output selecting circuit makes conduction between a common contact SWc connected to the line J and the individual contact SWa, and when the control signal Φ0 is at low level, it makes conduction between the common contact SWc and the individual contact SWb. Therefore, when the non-inversion value of the scalar product value calculated in the scalar product value calculating section Rc is larger than the inversion value, the non-inversion value is outputted to the line J from the line Wa through the individual contact SWa, and when the inversion value is larger than the non-inversion value, the inversion value is outputted to the line J from the line Wb through the individual contact SWb. Moreover, the control signal Φ0, which represents the code of the scalar product value, is outputted to the line Ja. In such a manner, the scalar product absolute value calculating section Rd can calculates the absolute value of the scalar product.

Therefore, the scalar product absolute value calculating section Rd can obtain the codeword $\vec{C}I$ for maximizing the absolute value of the scalar product for the input vector $\vec{x}$ from the codewords $\vec{C}1, \vec{C}2, \ldots,$ and $-\vec{C}1, -C2, \ldots$.
Moreover, in the image compressing unit $1a$, the scalar product absolute value calculating section Rd makes it possible to perform encoding through the mean-separated normalized vector quantization method. Furthermore, the mean value which is required for the decoding can be obtained in the step of encoding by using the mean value calculating circuit 11. Further, both the positive and negative codewords $\vec{C}k$ and $-\vec{C}k$ can be realized by using the common code component capacitor Hk, thereby making it possible to lower the cost and to save space.

Figure 11:
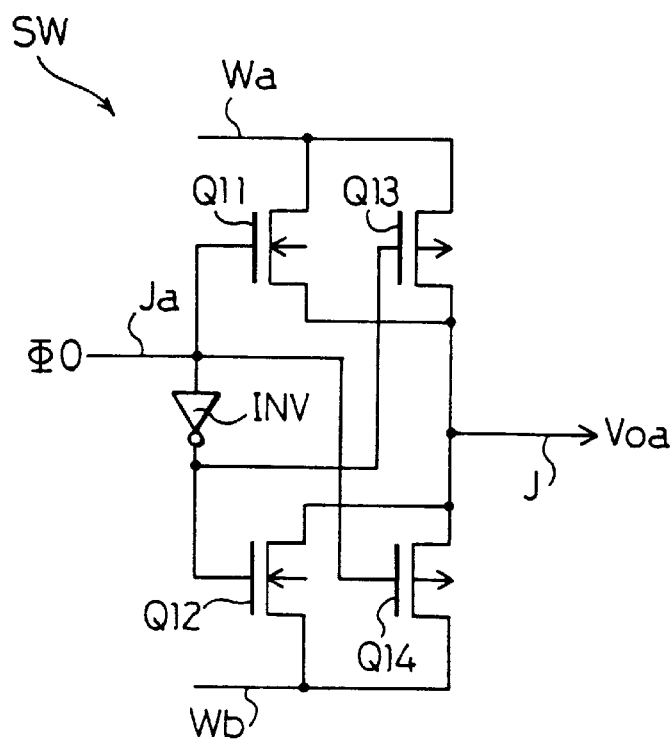
FIG. 11 is an electric circuit diagram which shows a concrete configuration of a switching circuit used for the scalar product absolute value calculating section shown in FIG. 10.

The switching circuit SW is realized by an arrangement shown in FIG. 11, for example. The switching circuit SW is arranged so as to have four field effect transistors Q11 through Q14 composed of MOS, and an inverter INV. The drains of the paired N-type transistors Q11 and Q12 are respectively connected to the lines Wa and Wb, and the sources are commonly connected to the line J. The control signal Φ0 is directly inputted to a gate of the transistor Q11 from the line Ja, and the control signal Φ0, which is inverted by the inverter INV, is inputted to a gate of the transistor Q12.

In addition, sources of the P-type transistors Q13 and Q14 are respectively connected to the lines Wa and Wb, and drains are commonly connected to the line J. The control signal Φ0, which is inverted by the inverter INV, is inputted to the gate of the transistor Q13, and the control signal Φ0 is directly inputted to the gate of the transistor Q14.

Therefore, when the control signal Φ0 is at high level, the transistors Q11 and Q13 are conducting so as to output a voltage, which represents the non-inverted scalar product value to be inputted through the line Wa, to the line J as the output voltage Voa. On the contrary, when the control signal Φ0 is at low level, the transistors Q12 and Q14 are conducting so as to output a voltage, which represents the inverted scalar product value to be inputted through the line Wb, to the line J. In such a manner, the signals of the non-inverted and inverted scalar product values are outputted to the line J irrespective of the positive and negative polarities.

The index encoding circuit 16a binarizes the index of the codeword $\vec{C}I$ for the maximum scalar product absolute value based upon the output voltage Voi from the output line Yi and the control signal Φ0 from the line Jai so as to output the encoded data to the output line 18.

The following details results of experiment by the inventor of the present invention. A dynamic picture image to be detected by the image sensor 2 is arranged so as to be 360 pixels×288 pixels per frame, and 30 frames per second, and 8 bits per pixel, namely, 256 gradation. As a result, pixel data per second becomes:

360×288×30×8=24,883,200 (bit), namely, about 25M bits.

Such an image is divided into the processing unit block 7 of 36 (=6×6) pixels as mentioned above, the mean-separated normalized vector quantization is performed per processing unit block 7 according to the code book that a number of codewords M=64.

First, an operating frequency is considered. According to a conventional digital calculation, in order to obtain the scalar product value of a vector of 36 dimensions (K), calculation of sum of products should be made 36 times. Therefore, when the number of the codewords M is 64 per one processing unit block 7, as mentioned above, the calculation of sum of products should be made 2,304 (=64×36) times. Therefore, the number of times of calculations per second becomes:

(360×288/36)×2,304×30=199,065,600 and the digital circuit using one arithmetic unit for sum of product requires the operating frequency of about 200 MHz.

On the contrary, in the analog circuit according to the present invention, since the calculations of scalar products which are required per one processing unit block 7 are simultaneously made, the required number of times of calculations becomes:

(360×288/36)×30=86,400 so the operating frequency becomes 86.4 KHz.

Next, a scale of the circuit is considered. In the case of the digital circuit, the number of transistors required to form a multiplier of 8 bits, for example, is:

546 (gate)×4 (transistor/gate)=2,184 (transistor).

Moreover, the number of transistors required to form an adder of 8 bits is:

104 (gate)×4 (transistor/gate)=416 (transistor).

Therefore, at least 2600 transistors are required for the calculation of the sum of products of 8 bits. Actually, more transistors for registers, etc. are required.

On the contrary, in the case of the analog circuit according to the present invention, when a capacitor array of 1pf is required to realize 256 gradations in the code component of each codeword, the capacitor array of 2,304 pf (=64×36) is required, and 64 differential amplifiers are required.

Next, the power consumption is considered. According to the design rule of 0.8 μm, in the case of the digital circuit, the power consumption of the multiplier of 8 bits becomes 90 mW in the operating frequency of 200 MHz, and the power consumption of an adder of 8 bits is 16 mW. Therefore, the power consumption of not less than 106 mW is required for the calculation of the sum of products.

On the contrary, in the case of the analog circuit according to the present invention, the power consumption of the capacitor array becomes:

$$fcv^2 = 86.4(KHz) \cdot 2304(pf) \cdot \{1.5(v)\}^2 = 448(\mu W)$$

Moreover, when the power consumption of the differential amplifier is 36 (MW) per one amplifier, the total power consumption of the differential amplifiers becomes:

36 (μW)×64=2,304 (μW), so the whole power consumption required for the calculation of the scalar products becomes 2752 (μW).

Therefore, the operating frequency and the power consumption can be lowered remarkably. Moreover, when the number of the codewords M is large as mentioned above, an area for the capacitor array becomes larger, so the scale of the circuit is increased several times, but the operating frequency is remarkably low. Therefore, peripheral circuits, such as the analog/digital converter, can be miniaturized, and the power consumption of the peripheral circuits can be remarkably lowered. In such a manner, in the image compressing units 1 and 1a according to the present invention, since the scalar product value is calculated by the analog circuit, the scale of the circuit can be decreased and the power consumption of the circuits can be lowered.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An encoding apparatus for taking in levels of analog signals, which were sampled with predetermined periods, as input vectors per predetermined processing unit block and encoding the analog signals based upon a vector quantization algorithm, said encoding apparatus comprising:

a plurality of scalar product value calculating sections being provided correspondingly to codewords representing learning vectors created from a plural kinds of signals for learning, said plural scalar product value calculating sections including elements having constants corresponding to plural code components composing the codewords, said plural scalar product value calculating sections calculating scalar products of the input vector and the codewords according to calculation using the constants of the elements, said each scalar product value calculating section including, a plurality of first capacitors and a plurality of second capacitors, said each capacitor being formed so as to have an electrostatic capacity as the constant, and receiving said analog signal sampled at one end, said first capacitors corresponding to a code component which is a positive coefficient, said second capacitors corresponding to a code component which is a negative coefficient, first and second differential amplifies having two input terminals and receiving a predetermined reference voltage at their respective non-inversion input terminals, an inversion input terminal of said first differential amplifier being commonly connected to the other terminal of said each first capacitor, an inversion input terminal of said second differential amplifier being commonly connected to the other terminal of said each second capacitor, a feedback capacitor for intervening between input and output terminals of said first and second differential amplifiers, a coupling capacitor which intervenes between an output terminal of said first differential amplifier and the inversion input terminal of said second differential amplifier, said coupling capacitor having an electrostatic capacity which is equal to an electrostatic capacity of said feedback capacitor connected to said first differential amplifier;

a correlation detecting section for detecting the codeword which is most correlative in the codewords to the input vector based upon the scalar product calculated by said scalar product value calculating section; and an encoding section for encoding an identification number for identifying the codeword which is detected by said correlation detecting section that the codeword is most correlative to the input vector.

2. The encoding apparatus according to claim 1, wherein said correlation detecting section detects a codeword, whose scalar product calculated by said scalar product value calculating section is largest, as the codeword which is most correlative to the input vector.

3. The encoding apparatus according to claim 1, further comprising:

a mean value calculating section which is provided parallel to said scalar product value calculating sections, said mean value calculating section being composed of said capacitors, said differential amplifier and said feedback capacitor like said scalar product value calculating sections, said capacitors respectively having equal electrostatic capacities, wherein said scalar product value calculating sections have absolute value calculating circuits for calculating absolute values of the calculated scalar products, wherein said first capacitors and second capacitors are formed so that sums of the respective electrostatic capacities are mutually equal, wherein said correlation detecting section detects the codeword out of the codewords for maximizing an absolute value of the scalar product calculated in said absolute value calculating circuit as the codeword which is most correlative to the input vector.

4. The encoding apparatus according to claim 3, wherein said absolute value calculating circuit includes:

an inverting amplifier for inverting polarity of an output signal from each of said scalar product value calculating sections;

a comparator for comparing a non-inversion value which is the output signal from each of said scalar product value calculating sections with an inversion value which is an output signal from said inverting amplifier; and an output selecting circuit for making selection from the non-inversion value or the inversion value based upon the output signal from said comparator so as to output the selected value, said output selecting circuit outputting the non-inversion value when the non-inversion value is larger than the inversion value and outputting the inversion value when the inversion value is larger than the non-inversion value.

5. An encoding apparatus for taking in levels of analog signals, which were sampled with predetermined periods, as input vectors per predetermined processing unit block and encoding the analog signals based upon a vector quantization algorithm, said encoding apparatus comprising:

a plurality of scalar product value calculating sections being provided correspondingly to codewords representing learning vectors created from a plural kinds of sigals for learning, said plural scalar product value calculating sections including elements having constants corresponding to plural code components composing the codewords, said plural scalar product value calculating sections calculating scalar products of the input vector and the codewords according to calculation using the constants of the elements, each of said scalar product value calculating sections including:

a plurality of first capacitors and a plurality of second capacitors for inputting the sampled analog signal to one ends thereof, said first capacitors having electrostatic capacities as constants corresponding to the code components which are positive coefficients, said second capacitors having electrostatic capacities as the constants corresponding to the code components which are negative coefficients;

a differential amplifier having a non-inversion input terminal connected to the other ends of said first capacitor and an inversion input terminal connected to the other end of said second capacitor;

a feedback capacitor which intervenes between the inversion input terminal and the output terminal of said differential amplifier; and a capacitor for applying a reference voltage to the non-inversion input terminal of said differential amplifier;

a correlation detecting section for detecting the codeword which is most correlative in the codewords to the input vector based upon the scalar product calculated by said, scalar product value calculating section; and an encoding section for encoding an identification number for identifying the codeword which is detected by said correlation detecting section that the codeword is most correlative to the input vector.

6. The encoding apparatus according to claim 5, further comprising:
a mean value calculating section which is provided parallel to said scalar product value calculating sections, said mean value calculating section being composed of said capacitors, said differential amplifier and said feedback capacitor like said scalar product value calculating sections, said capacitors respectively having equal electrostatic capacities,
wherein said scalar product value calculating sections have absolute value calculating circuits for calculating absolute values of the calculated scalar products,
wherein said first capacitors and second capacitors are formed so that the sums of the respective electrostatic capacities are mutually equal,
wherein said correlation detecting section detects the codeword out of the codewords for maximizing the absolute value of the scalar product calculated in said absolute value calculating circuit as the codeword which is most correlative to the input vector.

7. The encoding apparatus according to claim 6, wherein said absolute value calculating circuit includes:
an inverting amplifier for inverting polarity of an output signal from each of said scalar product value calculating sections;
a comparator for comparing a non-inversion value which is the output signal from each of said scalar product value calculating sections with an inversion value which is an output signal from said inverting amplifier; and
an output selecting circuit for making selection from the non-inversion value and the inversion value based upon the output signal from said comparator so as to output the selected value, said output selecting circuit outputting the non-inversion value when the non-inversion value is larger than the inversion value and outputting the inversion value when the inversion value is larger than the non-inversion value.

8. An encoding apparatus for taking in levels of analog signals, which were sampled with predetermined periods, as input vectors per predetermined processing unit block and encoding the analog signals based upon a vector quantization algorithm, said encoding apparatus comprising:
a plurality of scalar product value calculating sections being provided correspondingly to codewords representing learning vectors created from a plural kinds of signals for learning, said plural scalar product value calculating sections including elements having constants corresponding to plural code components composing the codewords, said plural scalar product value calculating sections calculating scalar products of the input vector and the codewords according to calculation using the constants of the elements,
each of said scalar product value calculating sections including:
a plurality of first capacitors and a plurality of second capacitors for inputting the sampled analog signal to one ends thereof, said first capacitors having electrostatic capacities as constants corresponding to the code components which are positive coefficients, said second capacitors having electrostatic capacities as the constants corresponding to the code components which are negative coefficients;
a first switching circuit for selectively supplying the sampled analog signals or a predetermined reference voltage to one ends of said first and second capacitors;
a differential amplifier having two input terminals, the other ends of said first and second capacitors being commonly connected to said one input terminal, the reference voltage being inputted to the other input terminal;
a feedback capacitor whose one end is connected to the input terminal of said differential amplifier;
a second switching circuit for selectively supplying an output voltage of said differential amplifier or the reference voltage to the other end of said feedback capacitor, said second switching circuit being linked to said first switching circuit; and
a switch for coupling the input and output terminals of said differential amplifier so that the terminals are short-circuited;
a correlation detecting section for detecting the codeword which is most correlative in the codewords to the input vector based upon the scalar product calculated by said, scalar product value calculating section; and
an encoding section for encoding an identification number for identifying the codeword which is detected by said correlation detecting section that the codeword is most correlative to the input vector.

9. The encoding apparatus according to claim 8, further comprising:
a mean value calculating section which is provided parallel to said scalar product value calculating sections, said mean value calculating section being composed of said capacitors, said differential amplifier and said feedback capacitor like said scalar product value calculating sections, said capacitors respectively having equal electrostatic capacities,
wherein said scalar product value calculating sections have absolute value calculating circuits for calculating absolute values of the calculated scalar products,
wherein said first capacitors and second capacitors are formed so that the sums of the respective electrostatic capacities are mutually equal,
wherein said correlation detecting section detects the codeword out of the codewords for maximizing an absolute value of the scalar product calculated in said absolute value calculating circuit as the codeword which is most correlative to the input vector.

10. The encoding apparatus according to claim 9, wherein said absolute value calculating circuit includes:
an inverting amplifier for inverting polarity of an output signal from each of said scalar product value calculating sections;
a comparator for comparing a non-inversion value which is the output signal from each of said scalar product value calculating sections with an inversion value which is an output signal from said inverting amplifier; and
an output selecting circuit for making selection from the non-inversion value and the inversion value based upon the output signal from said comparator so as to output the selected value, said output selecting circuit outputting the non-inversion value when the non-inversion value is larger than the inversion value and outputting the inversion value when the inversion value is larger than the non-inversion value.

11. An image compressing apparatus for taking in levels of analog picture signals, which were sampled by an image sensor with predetermined periods as input vectors per predetermined processing unit block, and encoding the analog picture signals based upon a vector quantization algorithm, said image compressing apparatus comprising:

a plurality of scalar product value calculating sections being provided correspondingly to codewords representing learning vectors created from a plural kinds of picture signals for learning, said plural scalar product value calculating sections including elements having constants corresponding to plural code components composing the codewords, said plural scalar product value calculating sections calculating scalar products of the input vector and the codewords according to calculation using the constants of the elements, said each scalar product value calculating section including, a plurality of first capacitors and a plurality of second capacitors, said each capacitor being formed so as to have an electrostatic capacity as the constant, and receiving said analog signal sampled at one end, said first capacitors corresponding to a code component which is a positive coefficient, said second capacitors corresponding to a code component which is a negative coefficient, first and second differential amplifies having two input terminals and receiving a predetermined reference voltage at their respective non-inversion input terminals, an inversion input terminal of said first differential amplifier being commonly connected to the other terminal of said each first capacitor, an inversion input terminal of said second differential amplifier being commonly connected to the other terminal of said each second capacitor, a feedback capacitor for intervening between input and output terminals of said first and second differential amplifiers, a coupling capacitor which intervenes between an output terminal of said first differential amplifier and the inversion input terminal of said second differential amplifier, said coupling capacitor having an electrostatic capacity which is equal to an electrostatic capacity of said feedback capacitor connected to said first differential amplifier;

a correlation detecting section for detecting the codeword which is most correlative in the codewords to the input vector based upon the scalar product calculated by said scalar product value calculating section; and an encoding section for encoding an identification number for identifying the codeword which is detected by said correlation detecting section that the codeword is most correlative to the input vector.

\* \* \* \* \*